(12) United States Patent
Chabloz

(10) Patent No.: US 7,378,907 B2
(45) Date of Patent: May 27, 2008

(54) SELECTIVE DIFFERENTIAL LOW-NOISE AMPLIFIER

(75) Inventor: Jérémie Chabloz, Renens (CH)

(73) Assignee: CSEM Centre Suisse d'Electronique et de Microtechnique SA Recherche et Developpement, Neuchatel (CH)

( * ) Notice: Subject to any disclaimer, the term of this patent is extended or adjusted under 35 U.S.C. 154(b) by 77 days.

(21) Appl. No.: 11/519,789

(22) Filed: Sep. 13, 2006

(65) Prior Publication Data

US 2007/0057725 A1    Mar. 15, 2007

(30) Foreign Application Priority Data

Sep. 14, 2005   (EP)   ................. 05291901

(51) Int. Cl.
    *H03F 3/45*   (2006.01)
(52) U.S. Cl. ...................... 330/253; 330/302
(58) Field of Classification Search ............... 330/253, 330/302

See application file for complete search history.

(56) References Cited

U.S. PATENT DOCUMENTS

| | | | | |
|---|---|---|---|---|
| 4,289,981 A | * | 9/1981 | Sakamoto et al. ............. 327/72 |
| 4,291,894 A | * | 9/1981 | D'Antonio et al. ......... 280/612 |
| 4,479,259 A | * | 10/1984 | Fenk ............................ 455/318 |
| 4,617,534 A | * | 10/1986 | Lill ........................ 331/117 R |
| 5,666,255 A | * | 9/1997 | Muelleman ................. 361/111 |
| 6,265,944 B1 | | 7/2001 | Conta et al. |
| 6,922,108 B2 | | 7/2005 | Lin |
| 7,092,691 B2 | * | 8/2006 | Bohn et al. ................. 455/280 |

FOREIGN PATENT DOCUMENTS

EP    1 548 932    6/2005

OTHER PUBLICATIONS

Galal et al, "40Gb/s Amplifier and ESD Protection Circuit in 0.18 μm CMOS Technology", Solid-State Circuits Conference, Session 26, 2004 IEEE, Feb. 15, 2004, pp. 480-489.

Runge et al, On-chip matched 5.2 and 5.8 GHz differential LNAs Fabricated using 0.35 μm CMOS technology, Electronics Letters, vol. 35, No. 22, Oct. 28, 1999, pp. 1899-1900.

* cited by examiner

*Primary Examiner*—Patricia Nguyen
(74) *Attorney, Agent, or Firm*—Jacobson Holman PLLC

(57) ABSTRACT

A selective differential low-noise amplifier includes a pair of transistors, each transistor of the pair being connected by its source to a current source and by its gate and/or its source to a differential voltage source, a coupling circuit between the gate of each transistor and the source of the other transistor of the pair, and, for each transistor of the pair, at least one series resonance and parallel resonance resonator connected in series between the source and/or the gate of the transistor and the differential voltage source.

10 Claims, 4 Drawing Sheets

SELECTIVE DIFFERENTIAL LOW-NOISE AMPLIFIER

BACKGROUND OF THE INVENTION

1. Field of the Invention

The present invention relates to a differential low-noise amplifier that differs from prior art differential low-noise amplifiers in that it includes series resonance and parallel resonance resonators to render it frequency selective.

2. Description of the Prior Art

One prior art differential low-noise amplifier is described in published European patent application EP 1 548 932, for example.

For a differential low-noise amplifier of that kind to be used in a radio signal receiver circuit, it is generally necessary to place it between two filters, an anti-blocking filter being disposed between a receiver antenna and the amplifier itself and an image rejection filter being disposed at the output of the amplifier.

The anti-blocking filter is necessary to prevent the receiver circuit from becoming saturated in the presence of strong out of band interference signals known as blocking signals. The image rejection filter is necessary to reject signals in the image band in the case of a "heterodyne" receiver.

It is also necessary to verify the matching of impedances between the antenna, the filters and the amplifier. The input impedance of the amplifier must correspond to the output impedance of the anti-blocking filter. Similarly, the input impedance of the anti-blocking filter must correspond to the impedance of the antenna and the output impedance of the amplifier must correspond to the input impedance of the image rejection filter.

Thus a radio signal receiver circuit includes a plurality of elements (amplifier, filters) whose input and output impedances must be matched.

The invention aims to solve the problems linked to the complexity of existing receiver circuits by providing a selective differential low-noise amplifier that does not necessitate the addition of antiblocking or image rejection filters on the upstream or downstream side or of impedance matching circuits.

SUMMARY OF THE INVENTION

The invention therefore consists in a selective differential low-noise amplifier including a pair of transistors, each transistor of the pair being connected by its source to a current source and by its gate and/or its source to a differential voltage source, a coupling circuit between the gate of each transistor and the source of the other transistor of the pair, and, for each transistor of the pair, at least one series resonance and parallel resonance resonator connected in series between the source and/or the gate of the transistor and the differential voltage source.

Associating this type of resonator with the pair of transistors of the differential low-noise amplifier provides a high Q filtering function and at the same time adjusts the input impedance of the differential amplifier by modifying the dimensions of the resonators.

Each coupling circuit is preferably a capacitive circuit.

The series resonance and parallel resonance resonator is preferably a resonator whose equivalent circuit includes a series RLC circuit connected in parallel with a capacitive circuit. Piezo-electric resonators, and in particular bulk acoustic wave (BAW) resonators, have this property.

In a preferred embodiment of the invention the differential low-noise amplifier includes, for each transistor of the pair, a first series resonance and parallel resonance resonator connected in series between the gate of the transistor and the differential voltage source and a second series resonance and parallel resonance resonator connected in series between the source of the transistor and the differential voltage source.

In particular, to provide the required impedance matching and filtering, the first resonator and the second resonator are detuned.

Furthermore, for the differential amplifier to be able to fulfill its voltage amplification function completely, the two transistors of the pair are connected by their drain to respective load circuits.

The two transistors of the pair are advantageously connected to their respective load circuits via two other transistors in a cascode configuration.

To improve the frequency selectivity of the differential low-noise amplifier, the aforementioned circuit is connected to the differential voltage source via a prefilter circuit including a symmetrical lattice circuit with four branches equipped with series resonance and parallel resonance resonators.

Each branch of the lattice circuit of the prefilter circuit preferably includes a resonator, two of the resonators of the lattice circuit, disposed face-to-face, being designed to have the same admittance as the resonators connected in series to the gate of the two transistors of the pair, the other two resonators of this lattice circuit, also disposed face-to-face, being designed to have the same admittance as the resonators connected in series to the source of the two transistors of the pair.

The invention will be better understood in the light of the following description given by way of example only and with reference to the appended drawings.

DETAILED DESCRIPTION OF THE PREFERRED EMBODIMENT

Figure 1:
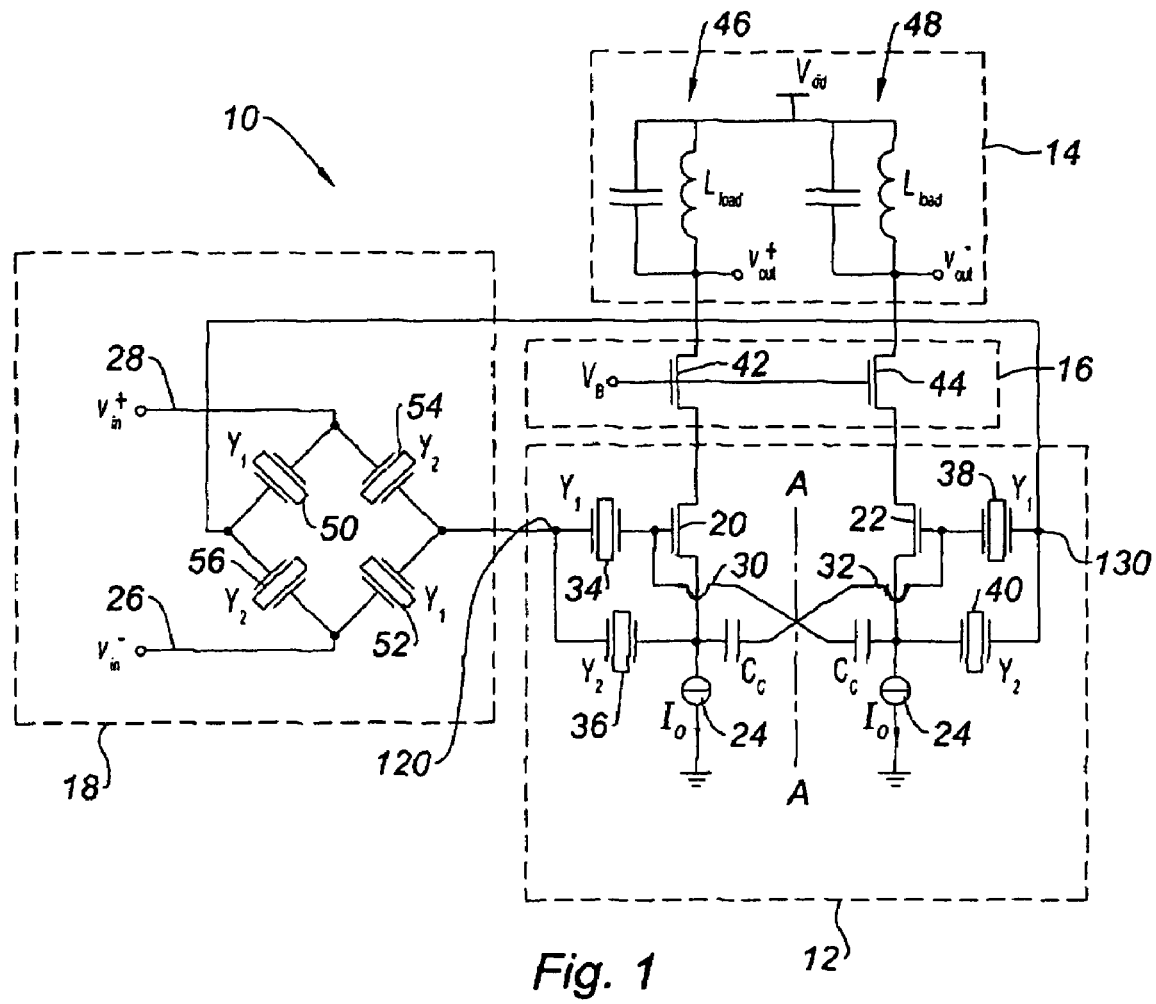
FIG. 1 is a diagram of a preferred embodiment of a differential low-noise amplifier of the invention.

The differential low-noise amplifier 10 represented in FIG. 1 includes a transconductance circuit 12 connected to a set 14 of load circuits via a cascode circuit 16. This differential low-noise amplifier 10 also includes a prefilter circuit 18.

More precisely, two transistors 20 and 22 in the transconductance circuit 12 are connected by their source to two identical sources 24 of a bias current $I_0$ and by their gate and their source to a differential voltage source including a negative source 26 and a positive source 28. The negative voltage source 26 produces a voltage of value $v_{in}^- = v_0 - \delta v$, for example, and the positive voltage source 28 produces a voltage of value $v_{in}^+ = v_0 + \delta v$, for example.

There is a first coupling circuit 30 between the gate of the transistor 20 and the source of the transistor 22. Similarly, there is a second coupling circuit 32 between the gate of the transistor 22 and the source of the transistor 20. These two coupling circuits 30 and 32 are preferably capacitive circuits, of equal capacitance $C_c$, as indicated in FIG. 1.

The transconductance circuit 12 further includes a first resonator 34 using series resonance and parallel resonance, for example a BAW type resonator, of admittance $Y_1$, connected in series between the gate of the transistor 20 and the differential voltage source. It also includes a second resonator 36, for example of the same type, of admittance $Y_2$, connected in series between the source of the transistor 20 and the differential voltage source. The first and second resonators 34 and 36 are preferably detuned.

Similarly, a third BAW resonator 38 is connected in series between the gate of the transistor 22 and the differential voltage source and a fourth BAW resonator 40 is connected in series between the source of the transistor 22 and the differential voltage source. Through considerations of symmetry, the admittance of the third resonator 38 has the value $Y_1$ and the admittance of the fourth resonator 40 has the value $Y_2$. The point common to the resonators 34 and 36 constitutes a first input node 120 of the transconductance circuit 12 and the point common to the resonators 38 and 40 constitutes a second input node 130 of that same transconductance circuit.

It will be noted that the resonators 34, 36, 38 and 40 connected in series to the gates and the sources of the transistors 20 and 22 are therefore coupled by the two capacitive coupling circuits 30 and 32 as well as by the transistors 20 and 22 themselves.

The functional characteristics of the resonators 34, 36, 38 and 40 are described in detail with reference to FIG. 2. The operation of the transconductance circuit 12, which is symmetrical about the axis A-A indicated in FIG. 1, is described with the aid of the small-signal equivalent half-circuit represented in FIG. 3.

The drain of the transistor 20 is connected to a first load circuit 46. Similarly, the drain of the transistor 22 is connected to a second load circuit 48. These two load circuits 46 and 48 are conventionally connected to each other and to a source of a voltage $V_{dd}$.

It will be noted that the load circuits 46 or 48 are parallel LC resonators the capacitive portion of which consists of stray capacitances and a capacitive load. The inductance $L_{load}$ of each of these circuits causes the capacitive portion to resonate at a frequency tuned to the useful band of the signal. The Q factor of the passive components used fixes the impedance obtained at resonance.

To increase the output impedance of the transconductance circuit 12, the transistors 20 and 22 are connected to the load circuits 46 and 48, respectively, via the cascode circuit 16, which includes two other transistors 42 and 44 connected in a cascode arrangement, their gates being connected to a common source of a voltage $V_B$. Each transistor 42 or 44 is connected to the drain of one of the transistors 20 or 22 and connected to the corresponding load circuit 46 or 48.

The cascode circuit 16 also limits the effect of the Miller capacitance on the overall stability of the differential low-noise amplifier 10.

The prefilter circuit 18 is connected between the input nodes 120 and 130 of the transconductance circuit 12 and the differential voltage source 26, 28.

It includes a symmetrical lattice arrangement with four branches equipped with resonators 50, 52, 54 and 56, for example BAW type resonators. The resonators 50 and 52, which are disposed face-to-face in the lattice arrangement, are carefully selected to have the same admittance $Y_1$ as the resonators 34 and 38. The resonators 54 and 56, which are also disposed face-to-face in the lattice arrangement, are selected to have the same admittance $Y_2$ as the resonators 36 and 40.

Adding this prefilter circuit 18 improves the frequency selectivity of the differential low-noise amplifier 10.

Figure 2:
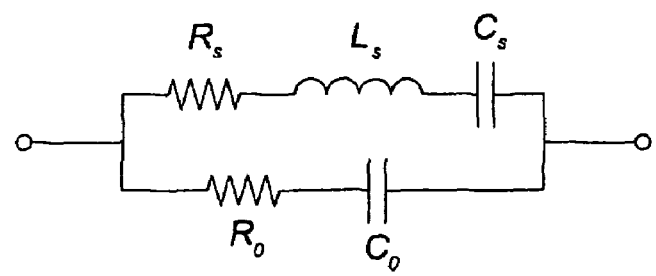
FIG. 2 is an equivalent circuit of a resonator used in the FIG. 1 amplifier.

FIG. 2 shows a first order equivalent circuit of the resonators 34, 36, 38, 40, 50, 52, 54 and 56 used in the differential low-noise amplifier 10.

It includes an RLC circuit comprising a resistor $R_s$, an inductor $L_s$ and a capacitor $C_s$, connected in parallel with a capacitive circuit comprising a resistor $R_0$ and a capacitor $C_0$.

Accordingly, the admittance y normalized at $Y_0$ of a resonator whose series resonant frequency has the value $\omega_s = k\,\omega_0$ is expressed by the following equation:

$$y = \frac{Y}{Y_0} = k \cdot \frac{\rho Q}{1 + jQx_k} + \frac{j\Omega}{1 + j\Omega\tan(\delta)/k}, \quad (1)$$

in which $x_k$ is the detuning defined by the following equation:

$$x_k = \frac{\Omega}{k} - \frac{k}{\Omega}. \quad (2)$$

In equation (1), $\rho$ is a technological factor that represents the piezo-electric coupling and Q is the Q factor of series resonance of the resonator whose equivalent circuit is represented in FIG. 2. The factor $\tan(\delta)$ is the loss factor of the dielectric capacitance, such that $R_0 Y_0 = \tan(\delta)/k$.

Finally, the normalization magnitudes used in equation (1) are given by the following table:

TABLE 1

| | Normalization magnitudes | |
|---|---|---|
| Magnitude | Normalization | |
| Frequency | $\Omega = \omega/\omega_0$ | $\Omega_s = \omega_s/\omega_0 = k$ |
| Admittance | $y = Y/Y_0$ | $Y_0 = \omega_0 \cdot C_0$ |
| Impedance | $z = Z \cdot Y_0$ | |
| Capacitance | $c = C/C_0$ | |

Equation (1) can be simplified as follows:

$$y \approx k \cdot \frac{\rho Q}{1 + jQx_k} + j\Omega, \text{ if } \Omega \ll \frac{k}{\tan(\delta)}. \quad (3)$$

It will be noted that the operating principle of the resonator described here is independent of the technique used to produce it. It must therefore be possible to use it with any type of resonator whose equivalent circuit corresponds to that of FIG. 2.

In the FIG. 1 circuit, the resonators 34, 38, 50 and 52 of admittance $Y_1$ have a series resonant frequency equal to $\omega_{1s} = k_{1s} \omega_0$ and the resonators 36, 40, 54 and 56 of admittance $Y_2$ have a different series resonant frequency equal to $\omega_{2s} = k_{2s} / \omega_0$. The ratio $k_{2s}/k_{1s}$ expresses the detuning of the resonators of admittance $Y_2$ relative to the resonators of admittance $Y_1$.

Figure 3:
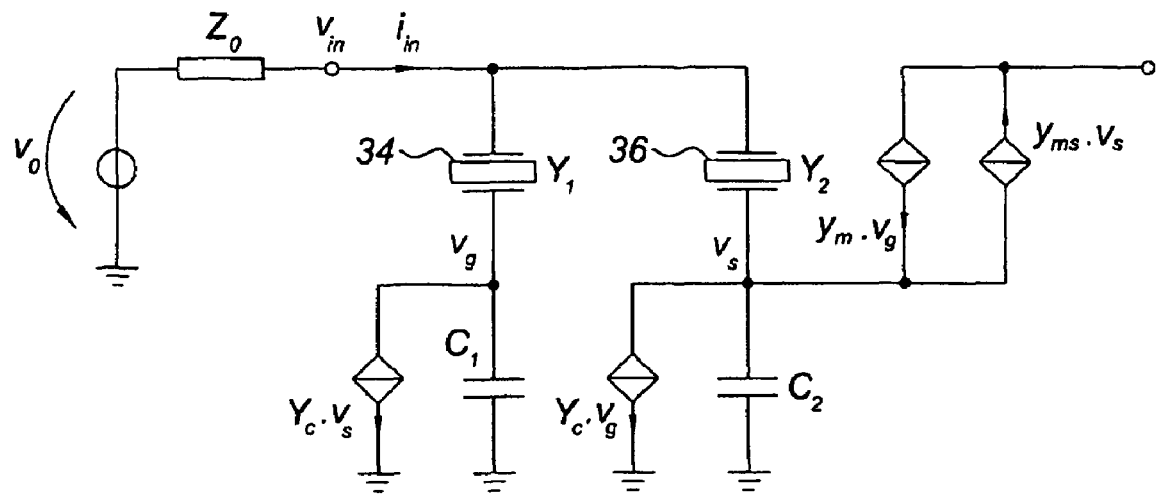
FIG. 3 is a small-signal equivalent half-circuit for modeling a transconductance circuit of the FIG. 1 differential amplifier.

The transconductance circuit 12 operates in differential mode and is exactly symmetrical. FIG. 3 shows its small-signal equivalent half-circuit.

This equivalent half-circuit is used to calculate the performance of the low-noise amplifier. The magnitudes $C_1$, $C_2$ and $Y_c$ used in FIG. 3 are defined by the following equations:

$$C_1 = C_c + C_{gs}, \quad (4)$$

$$C_2 = C_c + C_{gs}, \quad (5)$$

$$Y_c = j\omega \cdot (C_c - C_{gs}), \quad (6)$$

in which $C_{gs}$ represents the stray capacitance of the transistor 20 or 22 between its source and its gate.

Furthermore, $y_m$ and $y_{ms}$ represent transconductance parameters of voltage-controlled current sources.

For the transfer of power to be optimized it is necessary for the input impedance $Z_{in}$ of the differential low-noise amplifier to be matched to the impedance $Z_0$ of the antenna of the radio signal receiver circuit. This condition is expressed in mathematical terms by the following equation:

$$Z_0 = Z_{in}^*. \quad (7)$$

It is easy to calculate the impedance of the differential low-noise amplifier from the small-signal equivalent half-circuit:

$$Y_{in} = \frac{1}{Z_{in}} = H_1 \cdot Y_1 + H_2 \cdot Y_2, \quad (8)$$

in which $H_1$ is defined by:

$$H_1 = 1 - \frac{v_g}{v_{in}}, \quad (9)$$

and $H_2$ is defined by:

$$H_2 = 1 - \frac{v_s}{v_{in}}. \quad (10)$$

The auxiliary functions $H_1$ and $H_2$ are calculated as a function of the magnitudes of the small-signal equivalent half-circuit and given by the following equations, in which $s = j\omega$:

$$H_1 = 1 - \left(Y_2 - \frac{Y_1}{Y_c} \cdot (sC_2 + Y_2 + y_{ms})\right) \cdot \frac{1}{D}, \quad (11)$$

$$H_2 = 1 - \left((Y_c - y_m) \cdot \frac{Y_1}{Y_c} - \frac{sC_1 + Y_1}{Y_c} \cdot Y_2\right) \cdot \frac{1}{D}, \quad (12)$$

where $$D = Y_c - y_m - (sC_2 + Y_2 + y_{ms}) \cdot \frac{sC_1 + Y_1}{Y_c}. \quad (13)$$

Figure 4:
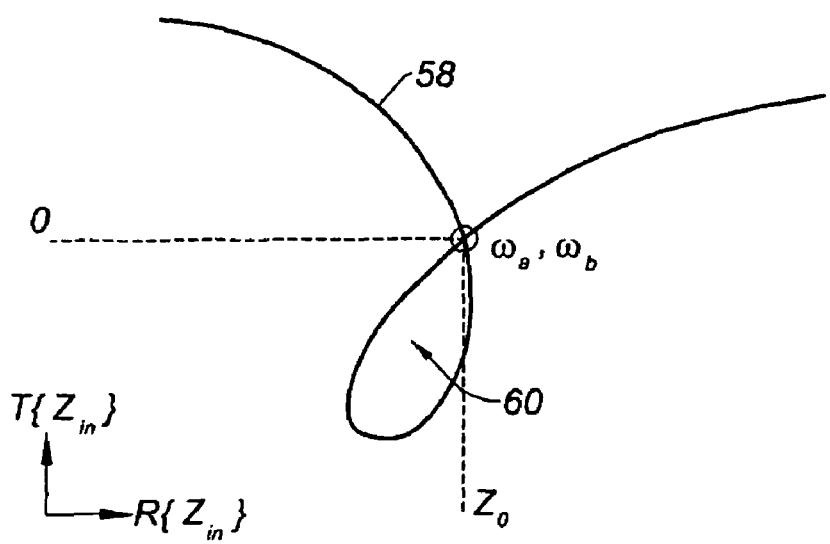
FIGS. 4 and 5 are diagrams indicating the input impedance values of the FIG. 1 amplifier that correspond to the numerical example set out in table 2.

From the above equations, which ignore the Miller capacitance (which is partly justified by the presence of the cascode circuit 16 connected to the transconductance circuit 12 which limits the effect of the Miller capacitance), the complex locus of the input impedance $Z_{in}$ of the differential low-noise amplifier 10 in the vicinity of the series resonance and parallel resonance frequencies of the resonators 34, 36, 38 and 40 has the general form shown in the FIG. 4 diagram. The curve 58 represents this complex locus.

Note that on this curve there are two frequencies $\omega_a$ and $\omega_b$ between the series resonance of the resonators 34 and 38 and the parallel resonance of the resonators 36 and 40, for which the input impedance is the same. Note also that, empirically, it is possible to cancel out the imaginary part of this input impedance completely by a careful choice of the capacitance $C_c$ of the coupling circuits 30 and 32.

Accordingly, by appropriately adjusting the dimensions of the resonators, it is possible to match the differential amplifier 10 perfectly to a real impedance $Z_0$ (that of the antenna) at the two different frequencies $\omega_a$ and $\omega_b$. Between these two frequencies, the value of the input impedance of the differential amplifier 10 varies little in the vicinity 60 of the point $(Z_0, 0)$ in the complex plane, as shown by the loop formed by the curve 58 in that vicinity 60.

A numerical example is given below. The normalized values from table 1 are repeated in table 2 below:

TABLE 2

| Normalized values for the numerical example | | |
|---|---|---|
| Quality factor | Q | 600 |
| Coupling factor | ρ | 0.054 |
| Dielectric loss factor | tan(δ) | 0.07 |
| Transconductance | $y_{ms}/Y_0$ | 0.7 |
| Gate-source capacitance | $C_{gs}/C_0$ | $60 \cdot 10^{-3}$ |
| $Y_1$ and $Y_2$ detuning factor | $k_{2s}/k_{1s}$ | 1.025 |
| Coupling capacitance | $C_c/C_0$ | 8.8925 |
| Matching frequencies | $\Omega_a = \omega_a/\omega_0$ | 1.0249 |
| | $\Omega_b = \omega_b/\omega_0$ | 1.0358 |
| Input impedance | $Z_{in}(\omega_a, \omega_b) \cdot Y_0 = z_0 \cdot Y_0$ | 0.6258 + 0 j |

Figure 5:
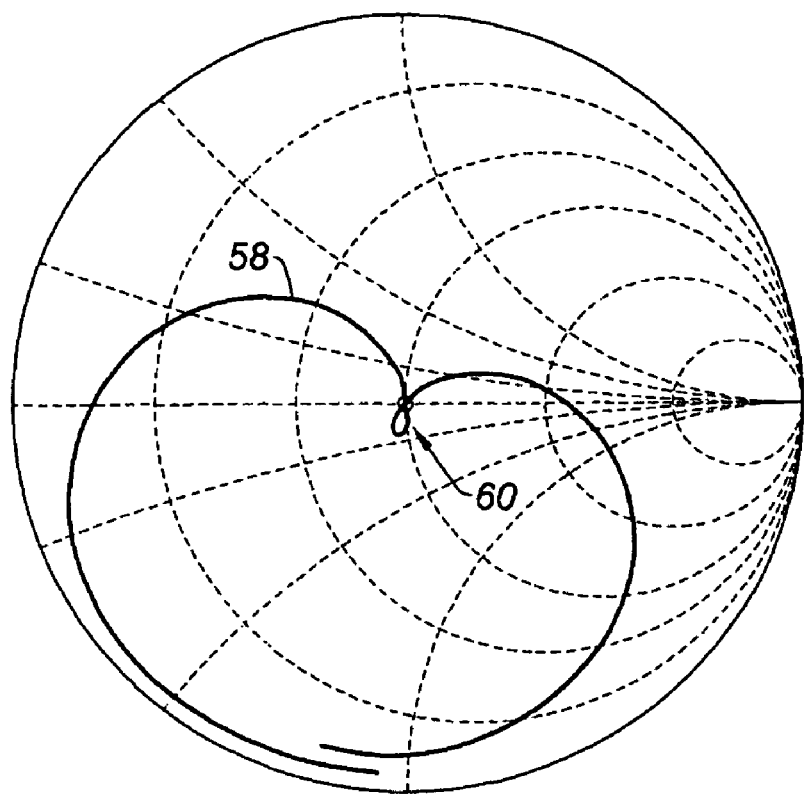

A different representation of the curve 58 in FIG. 5 using the Smith chart for values of Ω from 0.8 to 1.2 and for the numerical values set out in table 2 shows clearly that the input impedance $Z_{in}$ of the differential amplifier 10 is virtually constant between $\omega_a$ and $\omega_b$ and, more generally, the stability of the complex locus of $Z_{in}$, since the curve 58 remains within the unit circle of the Smith chart around the point $(Z_0, 0)$.

It is also possible to represent the impedance matching as a function of Ω by the parameter $\Gamma_{in}$ defined by the following equation:

$$\Gamma_{in} = \frac{Z_{in} - Z_0}{Z_{in} + Z_0}. \quad (14)$$

$\Gamma_{in}$ is the input reflection coefficient defined relative to the impedance $Z_0$ of the antenna. The FIG. 6 diagram represents the evolution of this coefficient for the numerical values from table 2. It will be noted that the two offset matching frequency values $\omega_a$ and $\omega_b$ provide for reasonable matching over a frequency band of around 2%.

Moreover, to measure the gain of the differential low-noise amplifier 10 independently of the load circuits, it is beneficial to represent the effective transconductance $g_{eff}$ by the following equation:

$$g_{eff} = \frac{i_{out}}{v_0} = \frac{i_{out}}{v_{in}} \cdot \frac{1}{1 + y_{in}z_0}, \quad (15)$$

where $$\frac{i_{out}}{v_{in}} = y_m \cdot \frac{v_g}{v_{in}} - y_{ms} \cdot \frac{v_s}{v_{in}} = \frac{y_{ms}}{n} \cdot (1 - H_1) - y_{ms} \cdot (1 - H_2). \quad (16)$$

Figure 7:
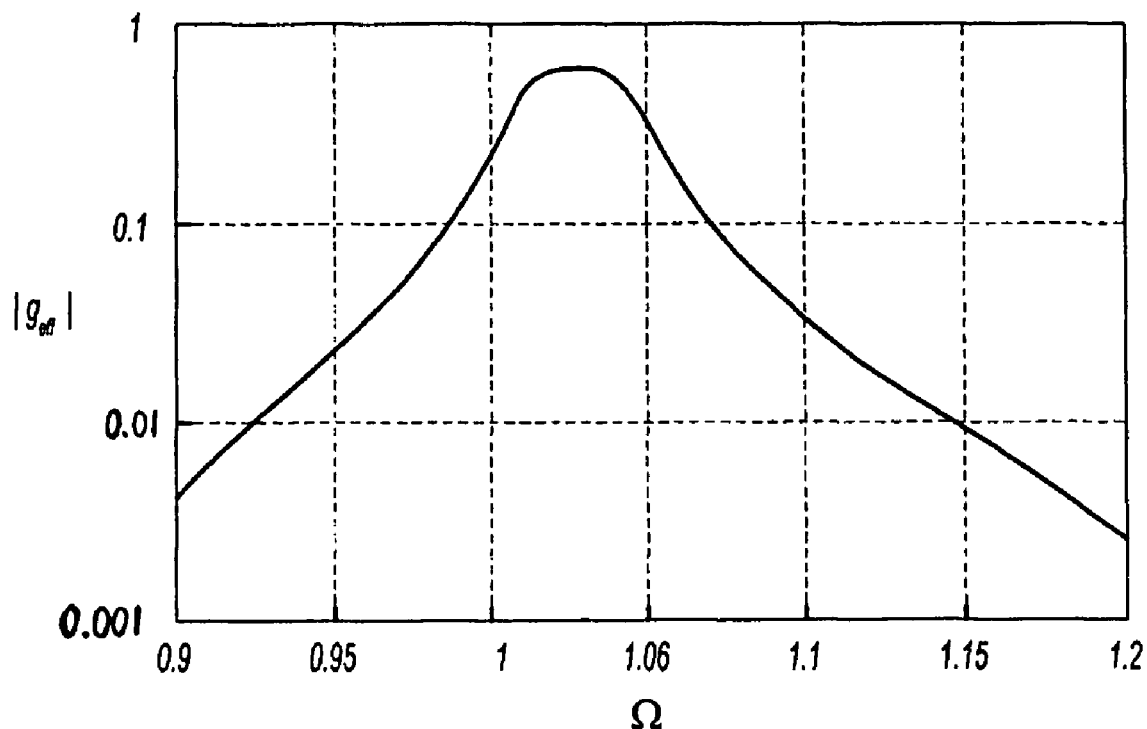
FIG. 7 is a diagram representing the modulus of the effective transconductance of the transconductance circuit modeled in FIG. 3 as a function of normalized frequency.

The FIG. 7 diagram is obtained by inserting the numerical values from table 2.

Figure 6:
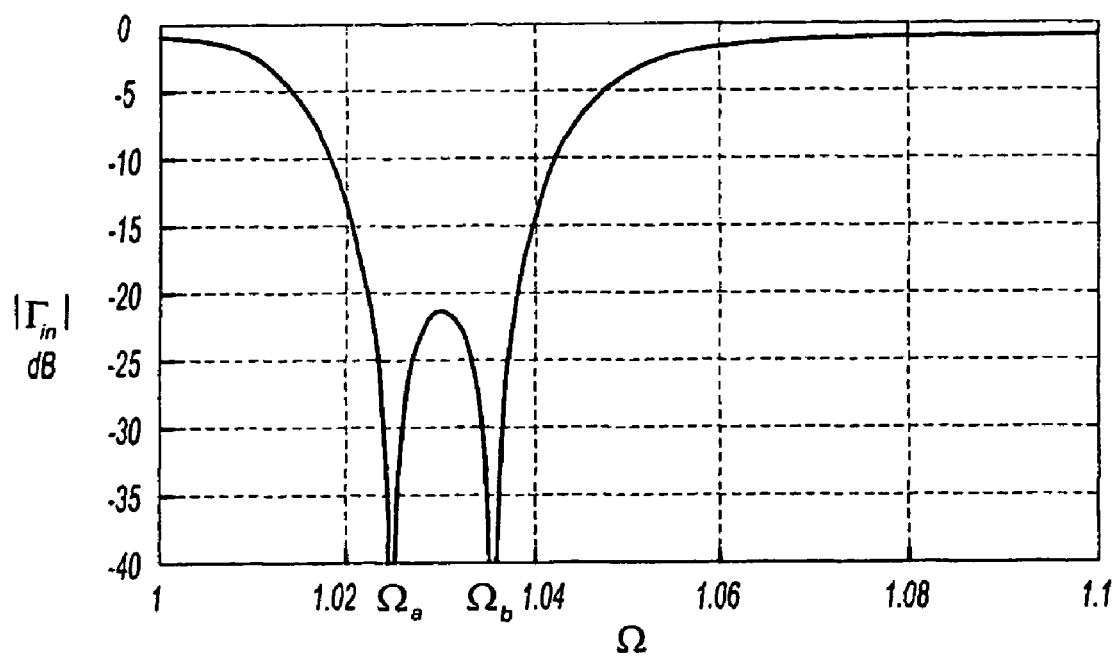
FIG. 6 is a diagram of the modulus of the input reflection coefficient of the transconductance circuit modeled in FIG. 3 as a function of normalized frequency.

Comparing FIGS. 6 and 7, note in particular that the bandwidth of the effective transconductance $g_{eff}$ corresponds to the frequency band $[\omega_a, \omega_b]$ in which impedance matching is effected.

Figure 8:
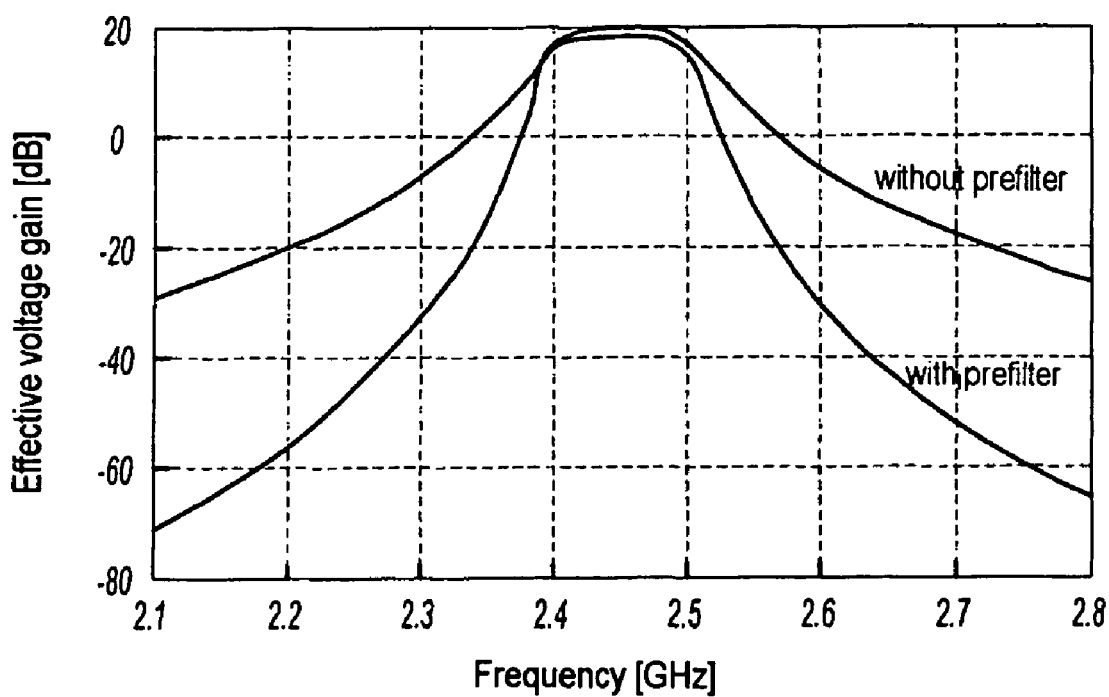
FIG. 8 is a diagram representing the effective voltage gain of the FIG. 1 differential amplifier as a function of frequency.

Finally, FIG. 8 shows the improvement resulting from the presence of the prefilter circuit 18 in the differential amplifier 10. The signals are more strongly attenuated outside the bandwidth $[\omega_a, \omega_b]$. Selectivity is thus significantly better.

It is clearly apparent that a differential low-noise amplifier as described above provides an amplification function combined with highly selective filtering of radio-frequency signals received by the antenna of the receiver circuit.

This kind of amplifier does not necessitate the addition of passive components over and above those already used to perform filtering. In particular, no antiblocking or image rejection filter is necessary.

The invention claimed is:

1. A selective differential low-noise amplifier including a pair of transistors, each transistor of said pair being connected by its source to a current source and by its gate and/or its source to a differential voltage source, a coupling circuit between the gate of each transistor and the source of the other transistor of said pair, and, for each transistor of said pair, at least one series resonance and parallel resonance resonator connected in series between the source and/or the gate of said transistor and said differential voltage source.

2. The selective differential low-noise amplifier according to claim 1, wherein each coupling circuit is a capacitive circuit.

3. The selective differential low-noise amplifier according to claim 1, wherein said series resonance and parallel resonance resonator is a resonator whose equivalent circuit includes a series RLC circuit connected in parallel with a capacitive circuit.

4. The selective differential low-noise amplifier according to claim 1, wherein said series resonance and parallel resonance resonator is a piezo-electric resonator, in particular a bulk acoustic wave resonator.

5. The selective differential low-noise amplifier according to claim 1, including, for each transistor of said pair, a first series resonance and parallel resonance resonator connected in series between the gate of said transistor and said differential voltage source and a second series resonance and parallel resonance resonator connected in series between the source of said transistor and said differential voltage source.

6. The selective differential low-noise amplifier according to claim 5, wherein said first resonator and said second resonator are detuned.

7. The selective differential low-noise amplifier according to claim 1, wherein the two transistors of said pair are connected by their drain to respective load circuits.

8. The selective differential low-noise amplifier according to claim 7, wherein the two transistors of said pair are connected to their respective load circuits via two other transistors in a cascode configuration.

9. The selective differential low-noise amplifier according to claim 1, wherein the two transistors of said pair are connected by their gate and their source to said differential voltage source via a prefilter circuit including a symmetrical lattice circuit with four branches equipped with series resonance and parallel resonance resonators.

10. The selective differential low-noise amplifier according to claim 9, wherein each branch of said lattice circuit of said prefilter circuit includes a resonator, two of said resonators of said lattice circuit, disposed face-to-face, being designed to have the same admittance as the resonators connected in series to the gate of the two transistors of said pair, the other two resonators of this lattice circuit, also disposed face-to-face, being designed to have the same admittance as the resonators connected in series to the source of the two transistors of said pair.

* * * * *